(12) United States Patent
Lee

(10) Patent No.: US 8,026,138 B2
(45) Date of Patent: Sep. 27, 2011

(54) METHOD FOR MANUFACTURING SEMICONDUCTOR APPARATUS HAVING SADDLE-FIN TRANSISTOR AND SEMICONDUCTOR APPARATUS FABRICATED THEREBY

(75) Inventor: Sang Don Lee, Guri-si (KR)

(73) Assignee: Hynix Semiconductor Inc., Icheon-si (KR)

( * ) Notice: Subject to any disclaimer, the term of this patent is extended or adjusted under 35 U.S.C. 154(b) by 260 days.

(21) Appl. No.: 12/265,399

(22) Filed: Nov. 5, 2008

(65) Prior Publication Data

US 2009/0294857 A1    Dec. 3, 2009

(30) Foreign Application Priority Data

May 30, 2008   (KR) .................. 10-2008-0050942

(51) Int. Cl.
*H01L 21/8242*   (2006.01)
(52) U.S. Cl. .......... 438/239; 257/E27.095; 257/E27.096
(58) Field of Classification Search .................. 438/142, 438/149, 197, 239, 241, 243, 396, 424; 257/E21.548, E27.095, E27.096
See application file for complete search history.

(56) References Cited

U.S. PATENT DOCUMENTS

| 7,160,780 B2 * | 1/2007 | Lee et al. ............. 438/283 |
| 7,394,116 B2 | 7/2008 | Kim et al. |
| 2005/0285204 A1* | 12/2005 | Kim et al. ............. 257/368 |
| 2007/0170474 A1* | 7/2007 | Kawasaki ............. 257/288 |
| 2008/0081420 A1* | 4/2008 | Kim ............. 438/268 |

FOREIGN PATENT DOCUMENTS

| KR | 10-0719180 | 5/2007 |
| KR | 10-0806610 | 2/2008 |

* cited by examiner

*Primary Examiner* — Brook Kebede
(74) *Attorney, Agent, or Firm* — Marshall, Gerstein & Borun LLP

(57) ABSTRACT

A method for manufacturing a semiconductor memory apparatus may include forming a channel region and a gate region through a self-alignment etching process on a cell region; and forming a three-dimensional multi-channel region through an etching process using a first multi-channel mask on a core region and a peripheral region and forming a gate region through an etching process using a second multi-channel mask, thereby preventing mis-arrangement of gates.

24 Claims, 14 Drawing Sheets

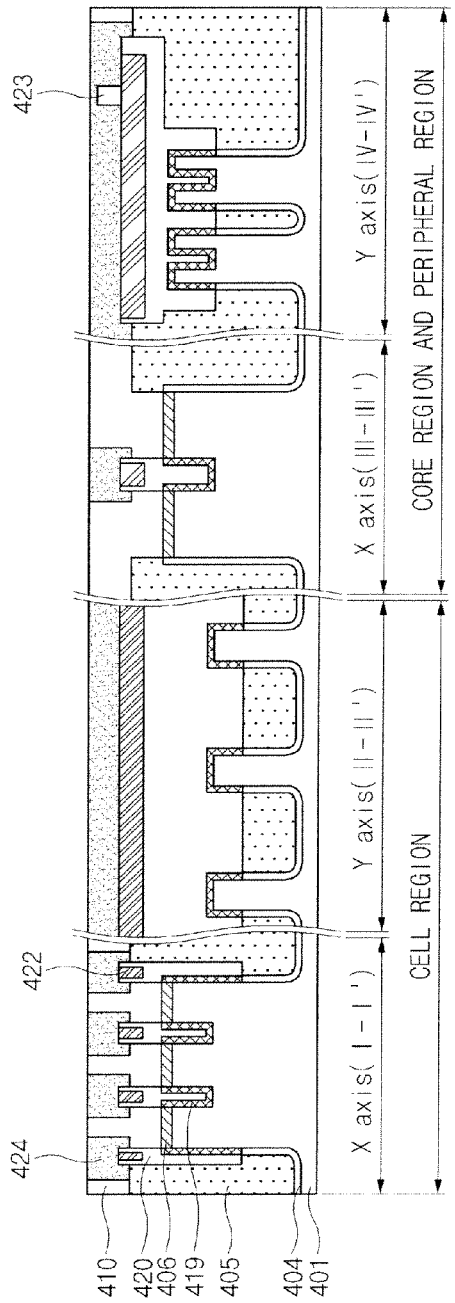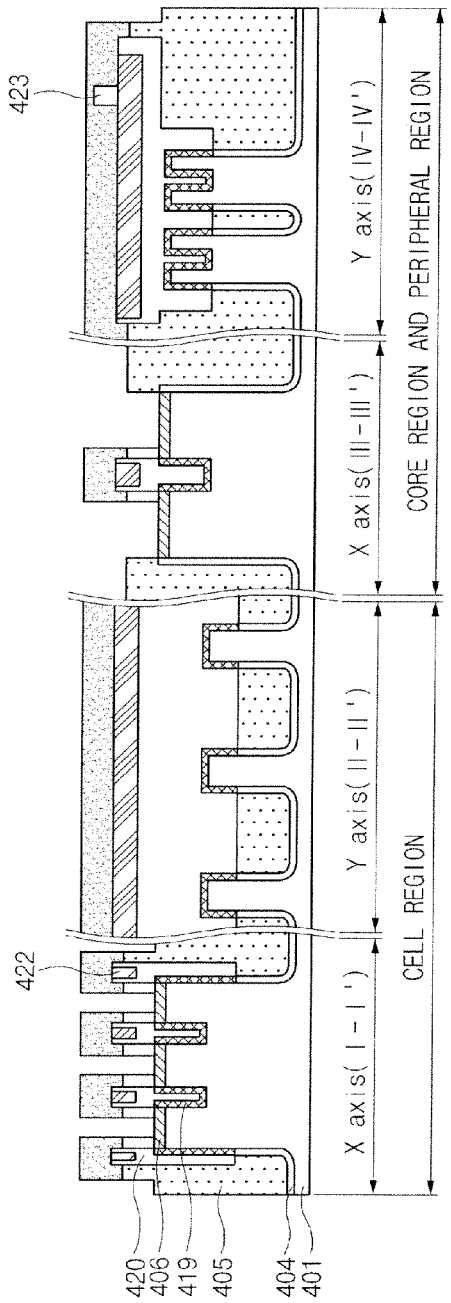
Fig. 4m
Fig. 4n

METHOD FOR MANUFACTURING SEMICONDUCTOR APPARATUS HAVING SADDLE-FIN TRANSISTOR AND SEMICONDUCTOR APPARATUS FABRICATED THEREBY

CROSS-REFERENCES TO RELATED APPLICATIONS

Priority is claimed to Korean patent application number 10-2008-0050942, filed on May 30, 2008, which is incorporated by reference in its entirety.

BACKGROUND OF THE INVENTION

The present invention generally relates to a method for manufacturing a high-integrated semiconductor apparatus, and more specifically, to a method for manufacturing a semiconductor apparatus with plural transistors such as a saddle-fin transistor and a multi-channel transistor.

A dynamic random access memory (DRAM) as a representative example of semiconductor apparatus includes a plurality of unit cells each including a capacitor and a transistor. A capacitor is used to temporarily store data, and a transistor is used to transmit data between a bit line and the capacitor in response to a control signal (word line) using a semiconductor property that is the electric conductivity changing depending on environment. The transistor includes a gate, a source and a drain, and charges move between the source and the drain in response to the control signal inputted into the gate. The movement of charges between the source and the drain is performed through a channel region using the semiconductor property. The source and the drain have first ends connected to a bit line, and second ends connected to the capacitor.

Due to increase in the data capacity and integration of the semiconductor memory apparatus, the size of each unit cell is required to be smaller. That is, the design rule of the capacitor and the transistor included in the unit cell is decreased, so that the channel length of the cell transistor is reduced to cause a short channel effect and a drain induced barrier lower (DIBL) effect in the transistor. Moreover, the junction resistance is increased by reduction of the junction area to reduce a driving current of the transistor, thereby degrading the reliability of the operation. By using a three-dimensional cell transistor, it is possible to secure the channel length of the cell transistor in a vertical direction although the design rule is reduced. When the channel length of the cell transistor is secured, the doping concentration in the channel region can be reduced, thereby preventing degradation of a refresh characteristic. Furthermore, in order to increase a driving current in the three-dimensional cell transistor, a saddle-fin transistor has been used.

BRIEF SUMMARY OF THE INVENTION

Various embodiments of the present invention provide a semiconductor memory apparatus that may include a saddle-fin transistor as a cell transistor and a transistor that has a three-dimensional channel but not a horizontal channel in a core region and a peripheral region to reduce mis-arrangement of gates, and a method for manufacturing the same.

According to an embodiment of the present invention, a method for manufacturing a semiconductor memory apparatus may include: forming a channel region and a gate region through a self-alignment etching process on a cell region; and forming a three-dimensional multi-channel region through an etching process using a first multi-channel mask on a core region and a peripheral region and forming a gate region through an etching process using a second multi-channel mask.

The method may further include forming a device isolation film over a semiconductor substrate.

The forming a channel region and a gate region may include: forming a self-aligned hard mask over the semiconductor substrate; and performing an etching process using the self-aligned hard mask.

The forming a self aligned hard-mask may include: forming a plurality of hard mask films over the semiconductor substrate; depositing a photoresist film over the hard mask films to pattern the photoresist film using a gate mask; and etching the hard mask films with the patterned photoresist film.

The hard mask films may include first to fifth hard mask films, the second hard mask film has the same etching selectivity as that of the fourth hard mask film, and the third hard mask film has the same etching selectivity as that of the fifth hard mask film.

The second and fourth hard mask films are formed with the same material, and the third and fifth hard mask films are formed with the same material.

The second hard mask film may include a silicon film, and the third hard mask film may include one selected from an oxide film, an oxide nitride film and a nitride oxide film.

The performing an etching process using the self-aligned hard mask may include: exposing the cell region using a cell open mask after forming a photoresist film over the resulting structure; and etching the semiconductor substrate and the device isolation film in the cell region using the self-aligned hard mask.

The forming a three dimensional multi-channel region and a gate region may include: forming the multi-channel region through an etching process performed on the semiconductor substrate using the first multi-channel mask; forming a self-aligned hard mask to be broader than the multi-channel region; and etching the insulating film and the device isolation film exposed of the multi-channel region using the second multi-channel mask to form the gate region.

The forming the multi-channel region may include: depositing a multi-channel forming film over the semiconductor substrate and the device isolation film; coating a photoresist film and etching the photoresist film with the first multi-channel mask to expose the multi-channel forming film; dry-etching the exposed multi-channel forming film so that the multi-channel forming film remains on the side surface of the device isolation film; etching the semiconductor substrate exposed between the residual multi-channel forming films; and removing the residual photoresist film; and forming an insulating film over the semiconductor substrate exposed by the etching process.

The forming the gate region may include: coating a photoresist film; etching the photoresist film using the second multi-channel mask whose width is broader than that of the first multi-channel mask so as to expose only the multi-channel region; etching a portion of the device isolation film and the insulating film in the exposed multi-channel region; and removing the residual photoresist film.

The method may further include forming a gate pattern in the gate region formed in the cell region, the core region and the peripheral region.

The gate pattern may include a conductive layer.

The gate pattern may include a gate lower electrode and a gate upper electrode disposed over the gate lower electrode.

The gate lower electrode of the gate pattern may surround the side surface of the gate upper electrode, the upper portion of the gate lower electrode and the gate upper electrode may be surrounded with the gate hard mask nitride film, and the lower portion of the gate lower electrode may be surrounded with an oxide film.

The forming a gate pattern may include: depositing a gate lower electrode over the gate region; depositing a gate upper electrode and a nitride film over the gate lower electrode to planarize the gate upper electrode and the nitride film; etching the gate lower electrode, the gate diffusion preventing metal film and the upper portion of the gate upper electrode; wet-etching a portion where the gate electrode is etched to broaden the width; and forming a gate hard mask nitride film in a space where the gate electrode is etched.

The forming a gate pattern may further include: forming a gate diffusion preventing metal film between the gate lower electrode and the gate upper electrode.

The forming a gate pattern may include: coating a photoresist film after forming the gate lower electrode; etching the photoresist film to expose the multi-channel region in the cell region, the core region and the peripheral region; etching the exposed gate lower electrode; and removing the residual photoresist film.

According to an embodiment of the present invention, a semiconductor memory apparatus may include: a unit cell including a saddle-fin transistor having a three-dimensional signal channel region as a cell transistor; and core and peripheral regions that include a multi-channel transistor having a three-dimensional multi-channel region.

The gate pattern included in the saddle-fin transistor and the multi-channel transistor may include a gate lower electrode that surrounds a side surface of a gate upper electrode, an upper portion of the gate lower electrode and a gate upper electrode that are surrounded with a gate hard mask nitride film, and a lower portion of the gate lower electrode that is surrounded with an oxide film.

According to another embodiment of the present invention, a method for manufacturing a semiconductor memory apparatus may include: forming a device isolation film over a semiconductor substrate; forming a multi-channel region in core and peripheral regions through an etching process using a first multi-channel mask; forming a self-hard mask in a cell region, the core and peripheral regions; simultaneously forming a channel region and a gate region in the cell region through a self-alignment etching process using the self-aligned hard mask; forming a gate region over the channel region in the core and peripheral regions through the self-alignment etching process and an etching process using a second multi-channel mask; and forming a gate pattern in the gate region of the cell, core and peripheral regions.

The forming a multi-channel region may include: depositing a multi-channel forming film over the semiconductor substrate and the device isolating film; coating a photoresist film and etching the photoresist film using the first multi-channel mask to expose the multi-channel forming film; dry-etching the exposed multi-channel forming film so that the multi-channel forming film remains on the side surface of the device isolation film; etching the semiconductor substrate exposed between the residual multi-channel forming film; removing the residual photoresist film; and forming an insulating film over the semiconductor substrate exposed by the etching process.

The forming a self-aligned hard mask may include: forming a plurality of insulating films over the semiconductor substrate and the device isolation film; depositing a photoresist film over the insulating films to pattern the photoresist film using a gate mask; and etching the insulating films with the patterned photoresist film.

The forming a channel region and a gate region may include: exposing the cell region; and etching the semiconductor substrate with the self-aligned hard mask.

The forming a gate region may include: coating a photoresist film; etching the photoresist film using the second multi-channel mask whose width is broader than that of the first multi-channel mask to expose the multi-channel region; etching a portion of the device isolation film and the insulating film in the exposed multi-channel region; and removing the residual photoresist film.

The saddle-fin transistor formed as a cell transistor may reduce mis-arrangement between a gate electrode and a fin region. The multi-channel fin transistor having a three-dimensional channel formed in the core region and the peripheral region may improve a short channel effect and a current driving capacity of the transistor in all regions of the semiconductor memory apparatus.

The saddle-fin transistor as a cell transistor formed to have a three-dimensional channel structure instead of a plane channel structure in the core region and the peripheral region may improve uniformity of characteristics of the transistor.

In one embodiment, a gate mask pattern may include a gate mask pattern for forming a gate structure of the cell transistor and a gate mask pattern for forming a gate structure of the transistor in the core region and the peripheral region. Using one gate mask pattern, the mis-arrangement between gate patterns of the transistor included in the core region and the peripheral region can be reduced, and operation defects and characteristic degradation of the semiconductor memory apparatus can be prevented.

DESCRIPTION OF EMBODIMENTS

Figure 1A:
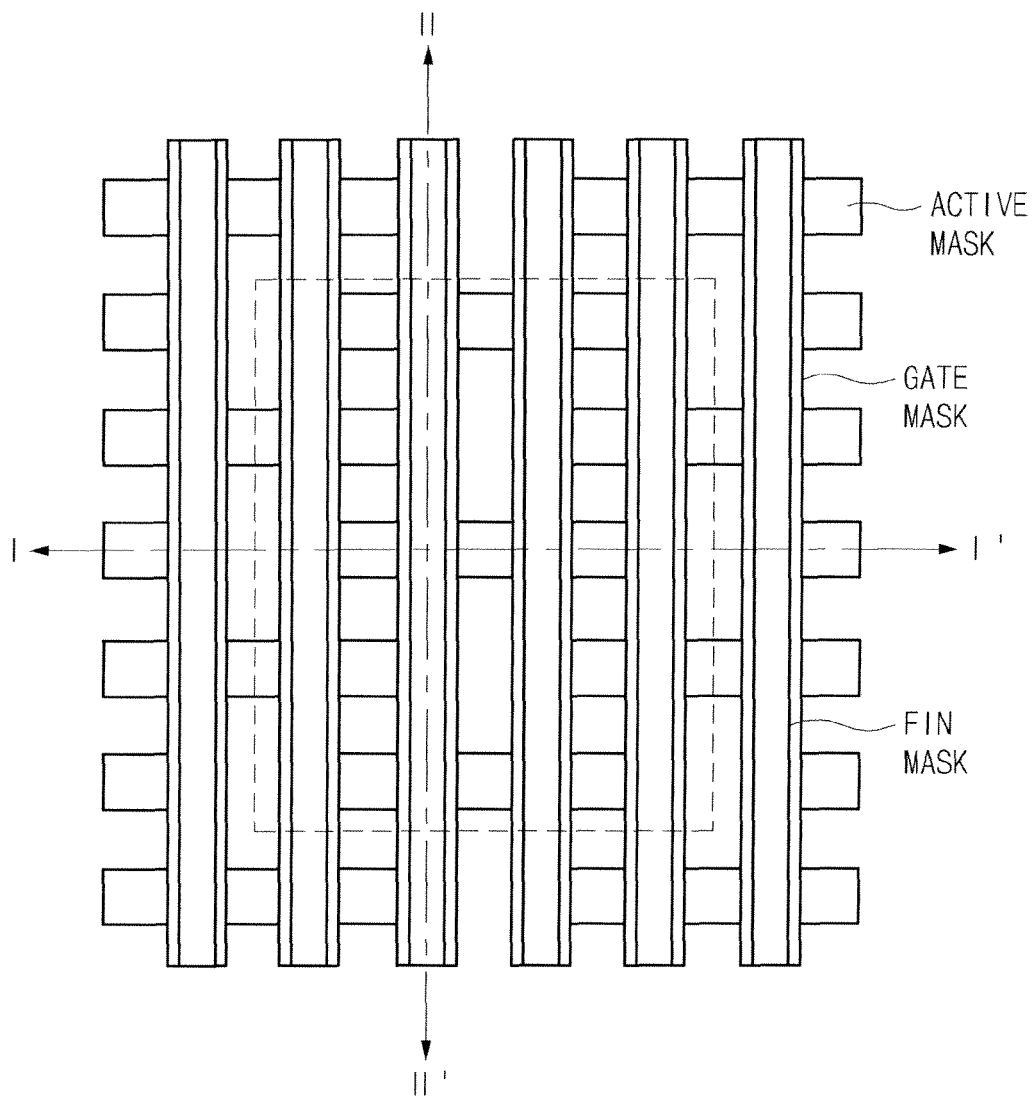
FIGS. 1a and 1b are plane diagram illustrating a mask pattern for fabricating a saddle-fin transistor of a semiconductor apparatus according to an embodiment of the present invention.
Figure 1B:
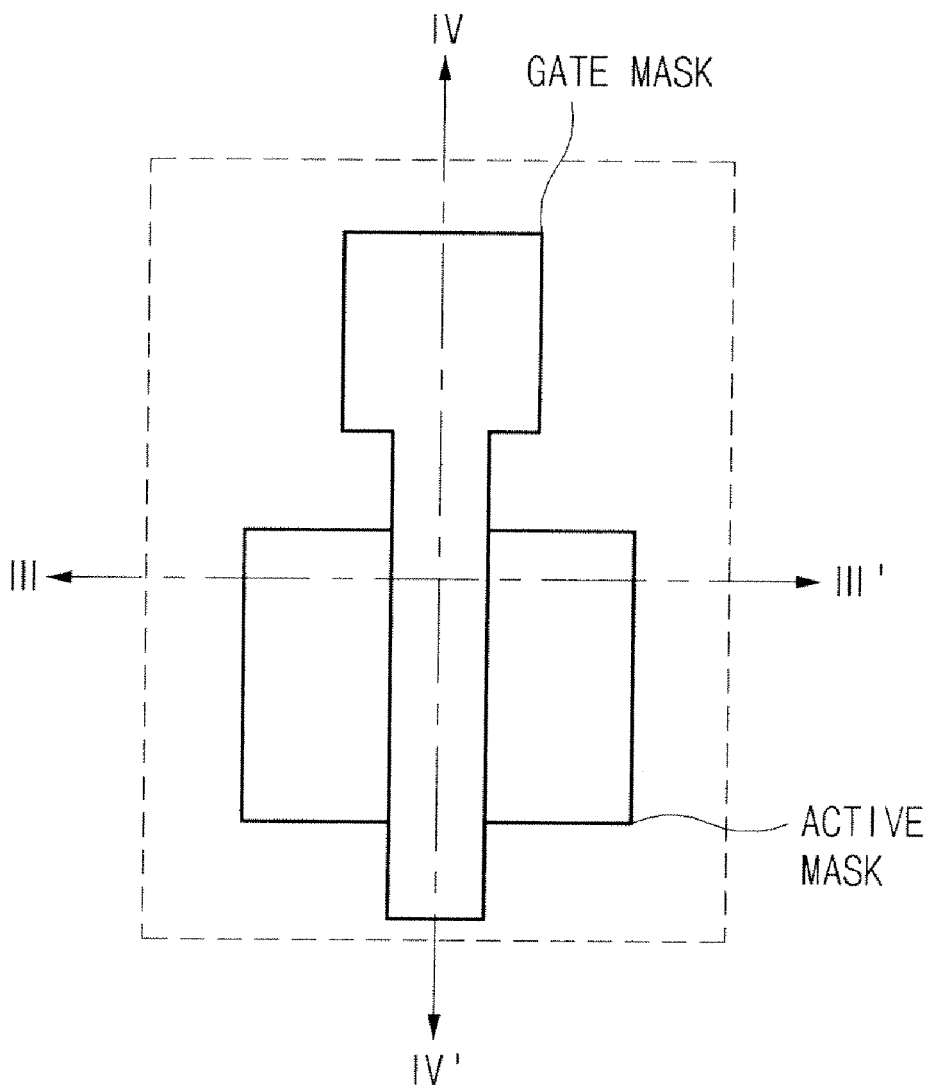
Figure 2A:
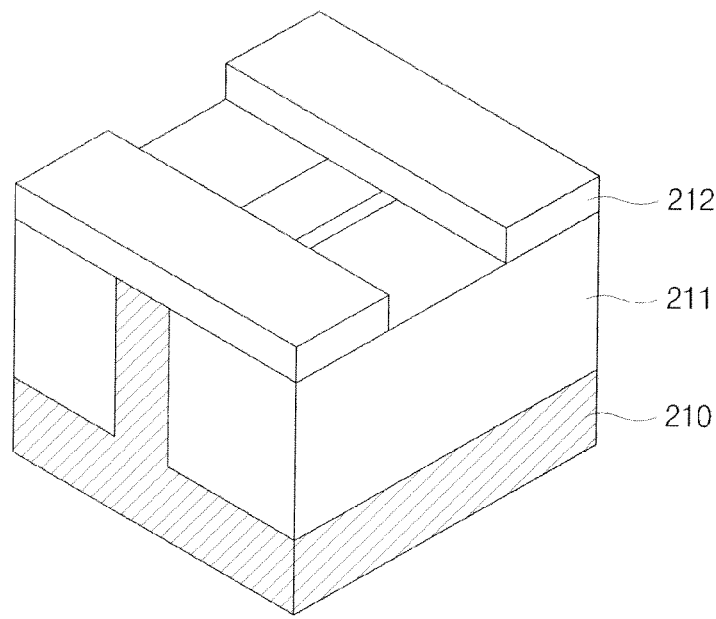
FIGS. 2a to 2f are perspective views illustrating a method of fabricating a saddle-fin transistor of a semiconductor apparatus using the mask pattern of FIG. 1.
Figure 2B:
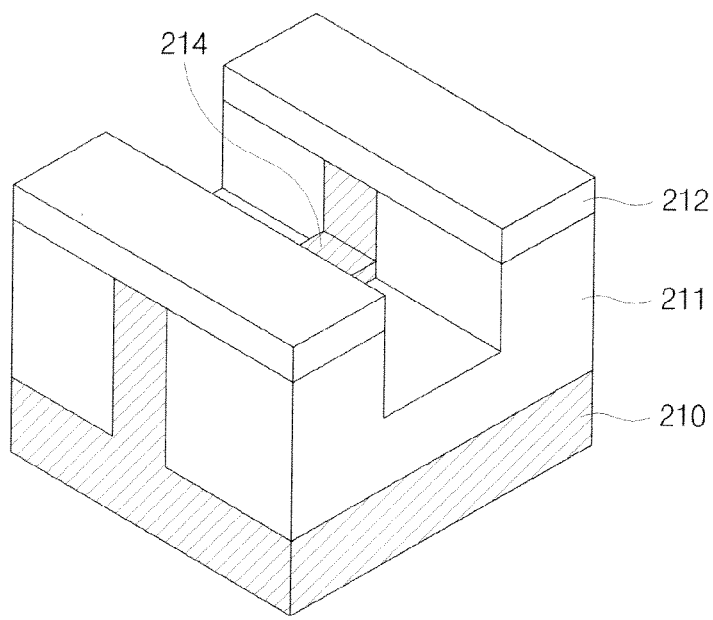
Figure 2C:
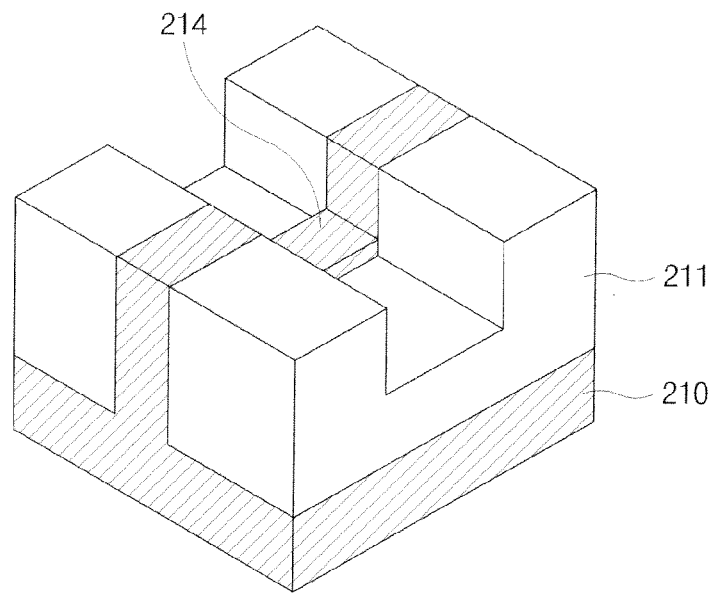
Figure 2D:
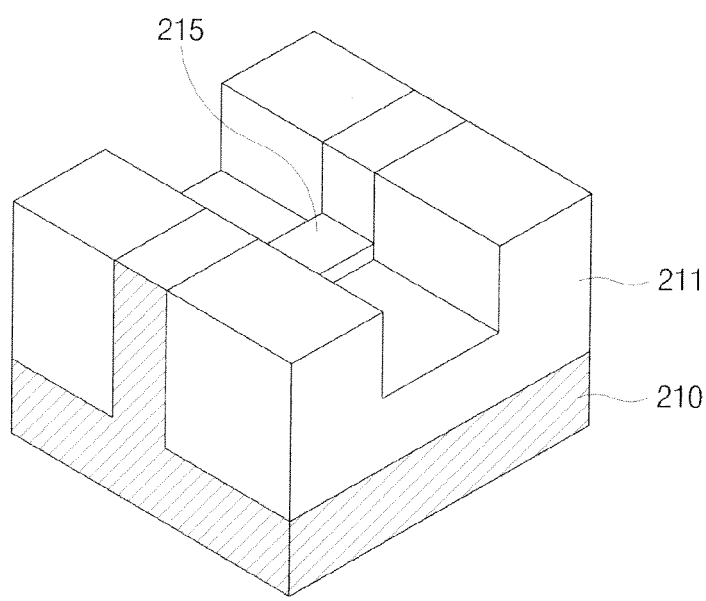
Figure 2E:
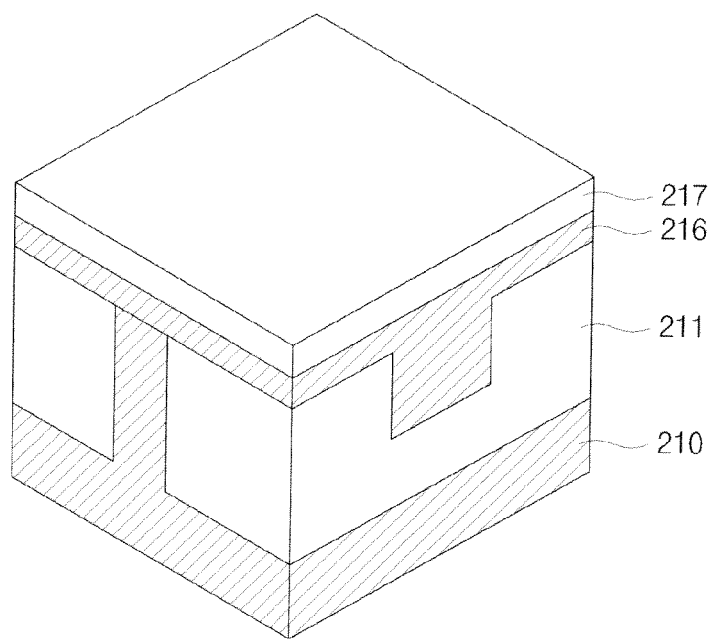
Figure 2F:
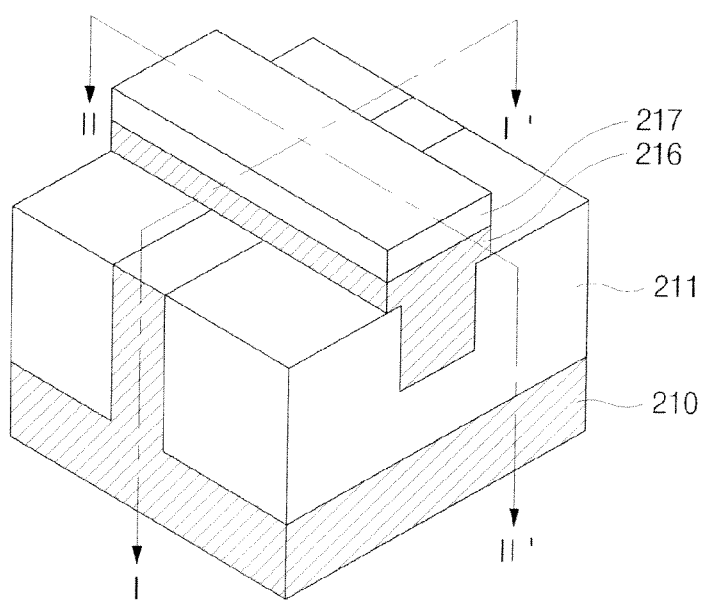

FIGS. 1 to 2f illustrate a process for fabricating a saddle-fin transistor having a three-dimensional channel structure that is used as a cell transistor.

FIG. 1a and 1b are plane diagrams illustrating a mask pattern for fabricating a saddle-fin transistor of a semiconductor apparatus according to an embodiment of the present invention.

Referring to FIG. 1a, active masks are arranged in a horizontal direction (I-I'), and a gate mask and a fin mask are arranged in a vertical direction (II-II'). The active masks, the gate mask, and the fin mask shown in FIG. 1a are used for manufacturing a saddle-fin transistor as a cell transistor included in each unit cell of the semiconductor memory apparatus.

Referring to FIG. 1b, active masks are arranged in a horizontal direction (III-III'), and gate masks are arranged in a vertical direction (IV-IV'), for manufacturing a transistor included in the core region and the peripheral region. The transistor, which is manufactured without any additional fin masks, has a horizontal channel region in a lower region of a gate electrode.

Like a common transistor, a saddle-fin transistor also includes an active region (source/drain region) and a gate region. However, for the saddle-fin transistor a fin is formed for securing a channel length and increasing a driving capacity. The following includes a discussion of a method of fabricating a saddle-fin transistor using an active mask, a gate mask and a fin mask.

FIGS. 2a to 2f are perspective views illustrating a method of fabricating a saddle-fin transistor of a general semiconductor apparatus using the mask pattern of FIG. 1.

As shown in FIG. 2a, a shallow trench isolation (STI) process is performed to form a device isolation film 211 in a semiconductor substrate 210. Specifically, an oxidation process is performed to form a pad oxide film (not shown) over the semiconductor substrate 210, and a pad nitride film (not shown) is deposited over a pad oxide film. The semiconductor substrate 210 is etched with a mask to determine a trench region where the device isolation film 211 is to be formed. After an insulating film is filled in the trench formed by the etching process, a chemical mechanical polishing (CMP) process is performed to form the isolated device isolation film 211 in the trench. A photo process is performed to form a fin mask pattern 212. The fin mask pattern 212 is a pattern for forming a fin. The fin increases a channel length of the saddle-fin transistor, so that the fin mask pattern 212 is formed to have a smaller interval between the patterns than that of a gate mask. The photo process for forming the fin mask pattern 212 includes a process for coating a photoresist film having a given thickness over the semiconductor substrate 210 and the device isolation film 211, and an exposing and developing process for forming the fin mask pattern 212 using a photo mask.

Referring to FIG. 2b, the semiconductor substrate 210 and the device isolation film 211 are etched with the fin mask pattern 212. The device isolation film 211 is etched with the highest etching selectivity between the silicon substrate 210 and the device isolation film 211, and the silicon substrate 210 is etched so that a saddle-fin 214 of the silicon substrate 210 remains. When the etching selectivity is adjusted inversely, the silicon substrate 210 is first etched, and the device isolation film 211 is etched to form the saddle-fin 214.

After the saddle-fin 214 is formed, as shown in FIG. 2c, the fin mask pattern 212 is removed. As shown in FIG. 2d, after the fin mask pattern 212 is removed, the exposed semiconductor substrate 210 and the surface of the saddle-fin 214 are oxidized to form a gate oxide film 215.

After the gate oxide film 215 is formed, gate electrode materials used as a gate of the saddle-fin transistor, that is, a polysilicon film 216 and a conductive film 217 are sequentially deposited (see FIG. 2e). The polysilicon film 216 fills the trench (fin region) and is deposited over the semiconductor substrate 210 and the device isolation film with a given thickness. The conductive film 217 is deposited over the polysilicon film 216 with a given thickness.

In a similar way to the fin mask pattern 212, the gate mask shown in FIG. 1 is formed over the conductive film 217. The polysilicon film 216 and the conductive film 217 are etched with the gate mask to form a gate structure of the saddle-fin transistor shown in FIG. 2f. As shown in FIG. 1, an interval between the gate mask patterns is formed to be broader than that between the fin mask patterns 212.

In the case of the above-described three-dimensional saddle-fin transistor, a mask pattern for forming a fin region and a gate structure is separated, and an interval between patterns in each mask pattern is different. In forming a saddle-fin transistor, the fin mask pattern 212 is distinguished from the gate mask, so that the fin mask pattern 212 and the gate mask can be mis-arranged. Furthermore, when a cell transistor included in a unit cell is formed in a semiconductor memory apparatus, the mis-arrangement between the fin mask pattern 212 and the gate mask as a ratio of the design rule (mis-arrangement/design rule) may gradually increase due to a decrease of the design rule.

As the design rule decreases, the mis-arrangement is a burden on the manufacturing process of the semiconductor memory apparatus. As the burden of the mis-arrangement increases, a process margin for fabricating the semiconductor memory apparatus is reduced. A leakage current between a gate and a bit line contact connected to a bit line (BL) junction of the cell transistor or a storage node plug connected to a storage node (SN) junction increases to cause operation defects of the cell transistor. The gate structure formed by the gate mask pattern may lean to one of the bit line junction or the storage node junction, which may degrade characteristics of the cell transistor in the semiconductor memory apparatus.

In addition to the mis-arrangement between the fin region and the gate structure of the three-dimensional saddle-fin transistor used as a cell transistor as described above, a core region including the unit cell and a peripheral region including input/output circuits may be mis-arranged when a different-sized transistor is formed consistent with a decreased design rule. In order to reduce the manufacturing process and time of the semiconductor memory apparatus, it is desirable to perform the common process in forming a transistor included in the core region and the peripheral region not on the individual region but on both regions. However, as the design rule decreases, the core region and the peripheral region may be mis-arranged to greater extent as a ratio to the design rule. The mis-arrangement may affect overall performance of the semiconductor memory apparatus. Moreover, the increase in process steps so as to prevent the mis-arrangement degrades productivity.

Due to reduction of the design rule, the size of the transistor formed in the core region and the peripheral region as well as the size of the cell transistor become smaller. The transistor formed in the core region and the peripheral region of the semiconductor memory apparatus manufactured with the mask pattern shown in FIG. 1b is a plane transistor having a horizontal channel region. The size of the gate pattern of the core and peripheral regions is larger than that of the cell transistor. However, the channel length of the transistor formed in the core region and the peripheral region of the semiconductor memory apparatus is also reduced, thereby generating limits of device characteristics such as the short channel effect.

The unit cell area of the semiconductor memory apparatus is reduced from 8F2 (F is the minimum pattern width by the design rule) to 6F2 or 4F2, so that the size of the transistor in the core region and the peripheral region becomes smaller, and the channel length of the transistor is also reduced. In order to prevent the reduction, in accordance with embodiments of the invention, the three-dimensional transistor having a multi-channel fin structure is used as a transistor of the core region and the peripheral region instead of the plane transistor having a horizontal channel. Specifically, a cell transistor having a general recess channel and a three-dimensional core transistor having a double fin channel are used in the embodiments shown. However, the cell transistor having a general recess channel has a lower driving current as compared to that of a cell transistor having a saddle-type channel. The difference between these driving currents becomes larger. As a result, when the cell transistor having a general recess channel is used as a cell transistor of the semiconductor memory apparatus, it may not be possible to secure the stability of the semiconductor memory apparatus due to the reduction of the driving currents.

Figure 3A:
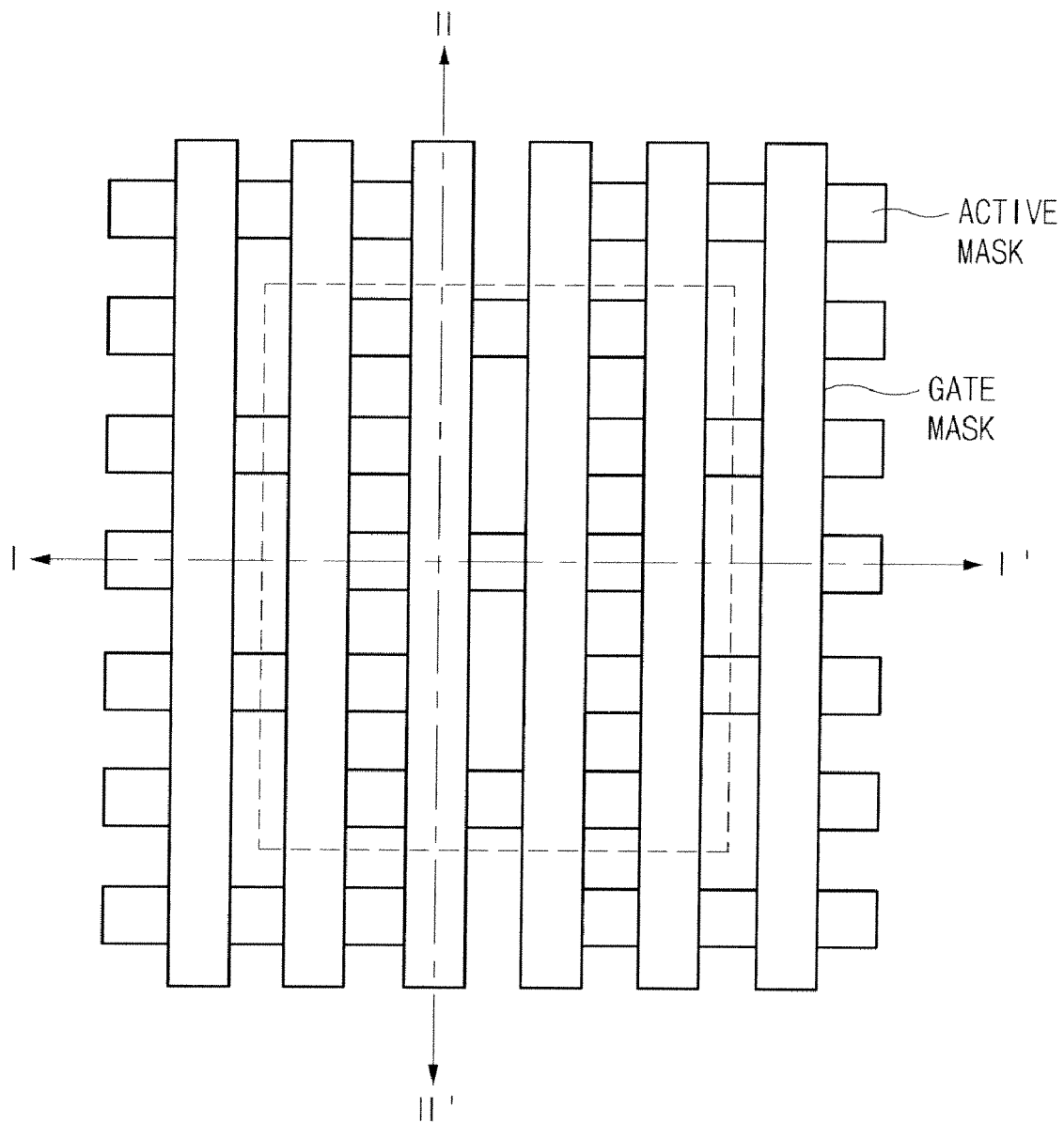
FIGS. 3a and 3b are plane diagrams illustrating a mask pattern for fabricating a saddle-fin transistor in a semiconductor apparatus according to an embodiment of the present invention.
Figure 3B:
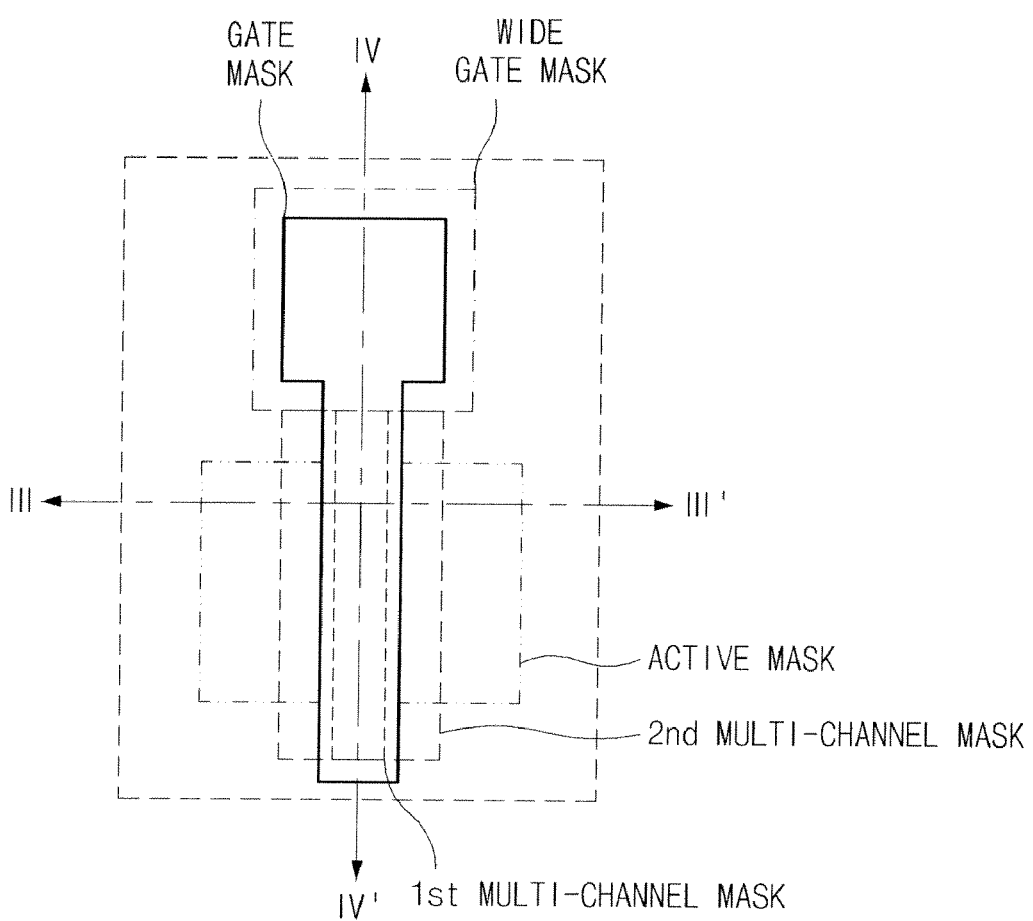

FIGS. 3a to 3b are plane diagrams illustrating a mask pattern for fabricating a saddle-fin transistor in a semiconductor apparatus according to an embodiment of the present invention.

Referring to FIG. 3a, a mask pattern for fabricating a saddle-fin transistor includes an active mask for forming source/drain regions and a gate mask for forming a gate region, which are two photoresist masks. The active mask and the gate mask are formed to be orthogonal with each other. The saddle-fin transistor includes a fin region formed to increase a channel length in a bottom portion of a gate electrode. In order to form the fin region and the gate electrode, a fin mask for forming the fin region and a gate mask for forming a gate electrode have been required in the conventional art. However, in the embodiment of the present invention, the fin region and the gate electrode can be formed with one mask to prevent the mis-arrangement generated when the two masks are used.

In the case of a semiconductor memory apparatus according to one embodiment of the present invention, the saddle-fin transistor is used as a cell transistor in each unit cell, and a transistor formed to have a three-dimensional channel region but not a horizontal channel region is included in the core region and the peripheral region except the cell transistor of the cell. That is, a fine region and a gate electrode of the cell transistor are formed with the gate mask shown in FIG. 3a, and a channel region and a gate electrode of the transistor of the semiconductor memory apparatus are formed with the gate mask and the multi-channel mask shown in FIG. 3b.

Referring to FIG. 3b, a mask for manufacturing a transistor included in the core region and the peripheral region according to an embodiment of the present invention further includes a first multi-channel mask and a second multi-channel mask for forming a three-dimensional channel region, and a wide-range gate mask for forming a gate electrode having a broad area. The first multi-channel mask, the second multi-channel mask, and the wide-range gate mask are supported to form a channel region and a gate electrode. The location and pattern of the gate electrode of the transistor in the core region and the peripheral region are determined by the gate mask.

In this illustrated embodiment of the present invention, one gate mask determines the location of plural transistors including the saddle-fin transistor included in the semiconductor memory apparatus. That is, a photo process is performed on one gate pattern that includes a pattern for forming the saddle-fin transistor shown in FIG. 3a and a gate pattern having a narrow channel region and a broad contact region, thereby reducing the mis-arrangement between the gate patterns of the transistor included in the core region and the peripheral region.

A method of fabricating a saddle-fin transistor formed as a cell transistor and a transistor formed to have a three-dimensional channel region in the core region and the peripheral region is described in detail with reference to cross-sectional diagrams in a X direction (I'-I") and in a Y direction (II'-II") shown in FIG. 3a and in a X direction (III'-III") and a Y direction (IV'-IV")

Figure 4A:
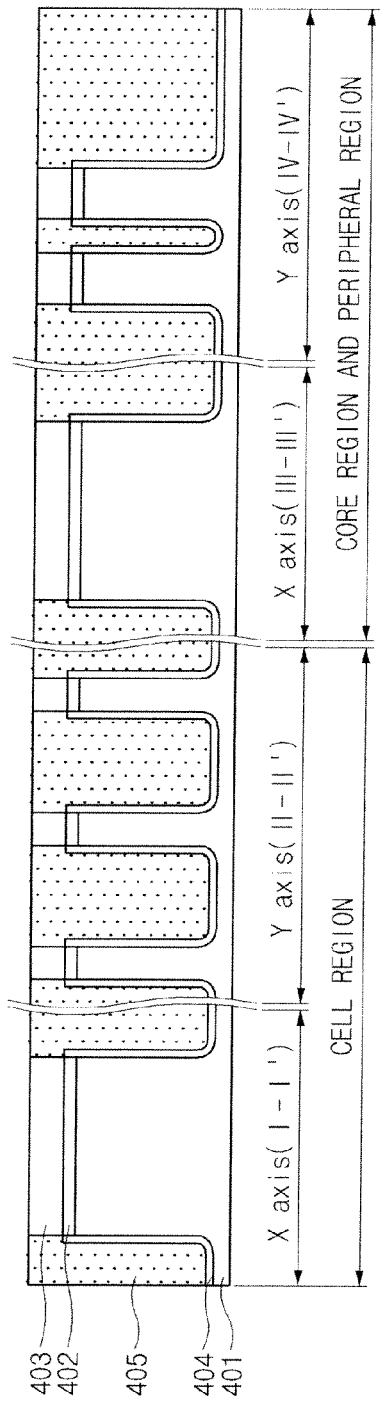
FIGS. 4a to 4n are cross-sectional diagrams illustrating a method of fabricating a semiconductor memory apparatus according to an embodiment of the present invention using the mask pattern of FIG. 3.

FIGS. 4a to 4n are cross-sectional diagrams illustrating a method of fabricating a semiconductor memory apparatus according to an embodiment of the present invention using the mask pattern of FIG. 3.

Referring to FIG. 4a, a shallow trench isolation (STI) process is performed on a semiconductor substrate 401 to form a device isolation film 405. In the STI process, an oxidation process is performed on the silicon substrate 401 to form a pad oxide film 402, and a pad nitride film 403 is deposited over the pad oxide film 402. After the pad nitride film 403 is deposited, an etching process is performed on the pad nitride film with an active mask to form a trench in the silicon substrate 401. A STI insulating Film 404 is formed over the exposed surface of the trench of the silicon substrate 401, and an insulating film is deposited to fill the trench. A chemical mechanical polishing (CMP) process is performed to expose the pad nitride film 403, so that an isolation film 405 is formed in the silicon substrate 401 as shown in FIG. 4a.

Figure 4B:
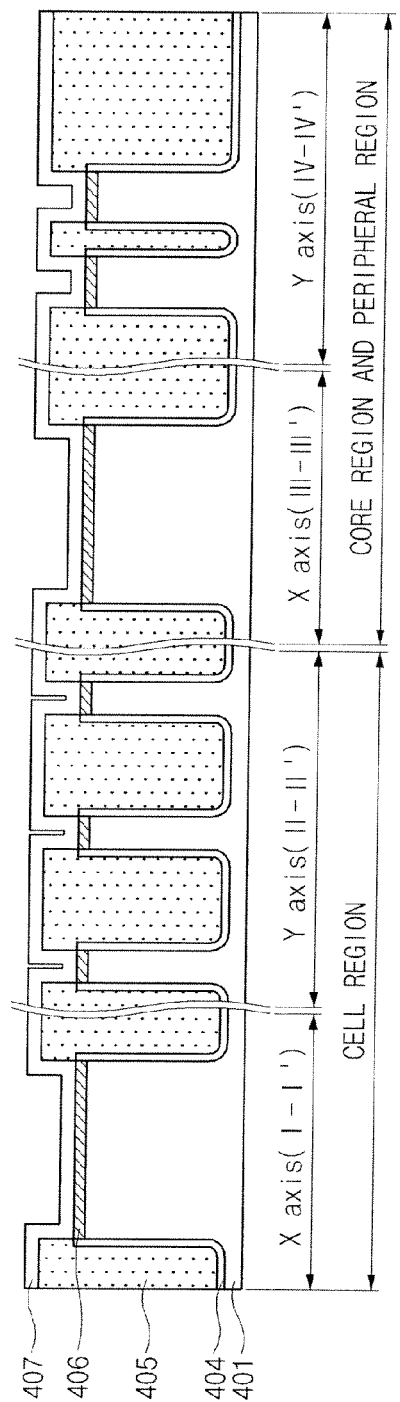

Referring to FIG. 4b, after the CMP process, the exposed pad nitride film 403 and the exposed pad oxide film 402 are removed. As a result, while the pad nitride film 403 is removed, the isolation film 405 is formed to be higher than the silicon substrate 401 by the thickness of the pad nitride film. While the pad nitride film 403 and the pad oxide film 402 are removed, a first buffer oxide film 406 is formed over the exposed semiconductor substrate 401. Generally, the first buffer insulating film 406 includes an oxide film. After the first buffer oxide film 406 is formed, a photo process is performed on a place where a transistor between the plural isolation films 402 formed in the semiconductor substrate 401 is formed using an implant mask for forming a well and a channel region which are not shown, thereby implanting impurities. If necessary, an ion-implanting process for forming a LDD region of the cell transistor may be further performed. After the well and the channel region are formed, the residual photoresist film (not shown) used in the ion-implanting process is removed. A multi-channel forming film 407 is deposited with a given height over the semiconductor memory apparatus.

Figure 4C:
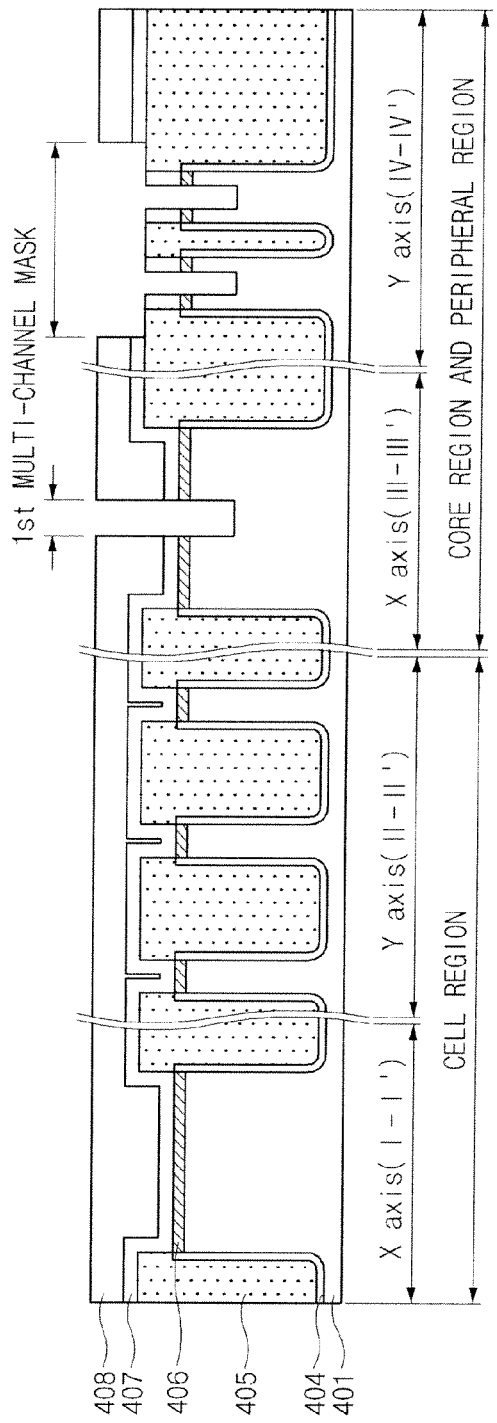

As shown in FIG. 4c, a first photoresist film 408 is deposited over the channel forming film 407. The region where the multi-channel of the transistor in the core region and the peripheral region is opened with the first multi-channel mask shown in FIG. 3b. A dry-etching process is performed on the multi-channel forming film 407 exposed by the opening of the first photoresist film 408 so that the channel forming film 407 may remain only on the side surface of the isolation film 405. That is, the multi-channel forming film 407 exposed by the multi-channel mask is etched to expose the upper portion of the isolation film 405. The first buffer insulating film 406 exposed between the multi-channel forming films 407 is etched with the multi-channel forming film 407 formed on the side surface of the isolation film 405 as a mask. Then, the exposed semiconductor substrate 401 is etched to form a multi-channel structure in the transistor of the core region and the peripheral region. As a result, the channel region of the transistor in the core region and the peripheral region can be formed to be not two-dimensional but three-dimensional. Furthermore, a multi-channel fin transistor including plural fin channels can be obtained in one transistor.

Figure 4D:
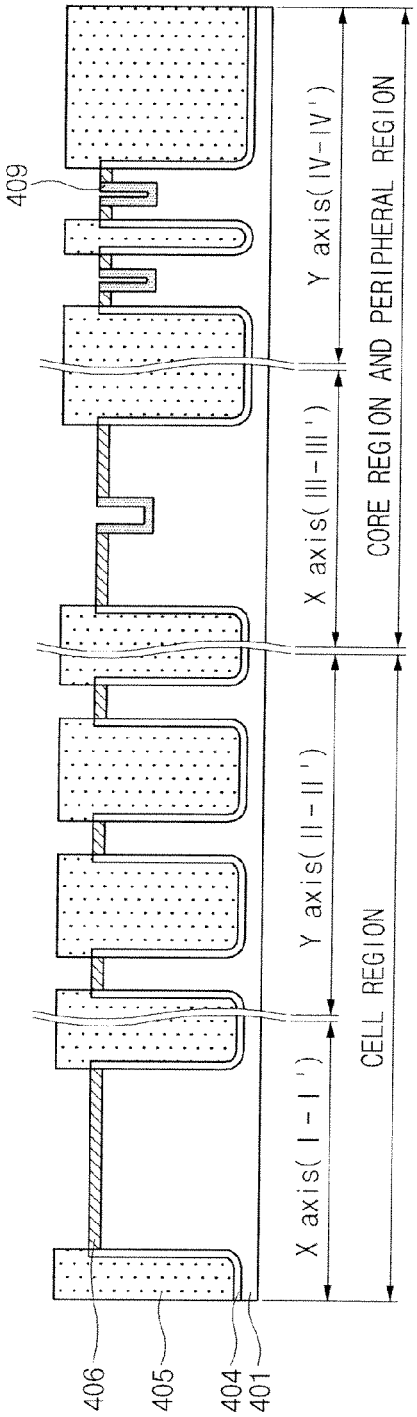

As shown in FIG. 4d, the first photoresist film 408 is removed. A second buffer insulating film 409 is grown in the semiconductor substrate 401 exposed in the transistor of the core region and the peripheral region. The multi-channel forming film 407 is removed by a wet-etching process.

Figure 4E:
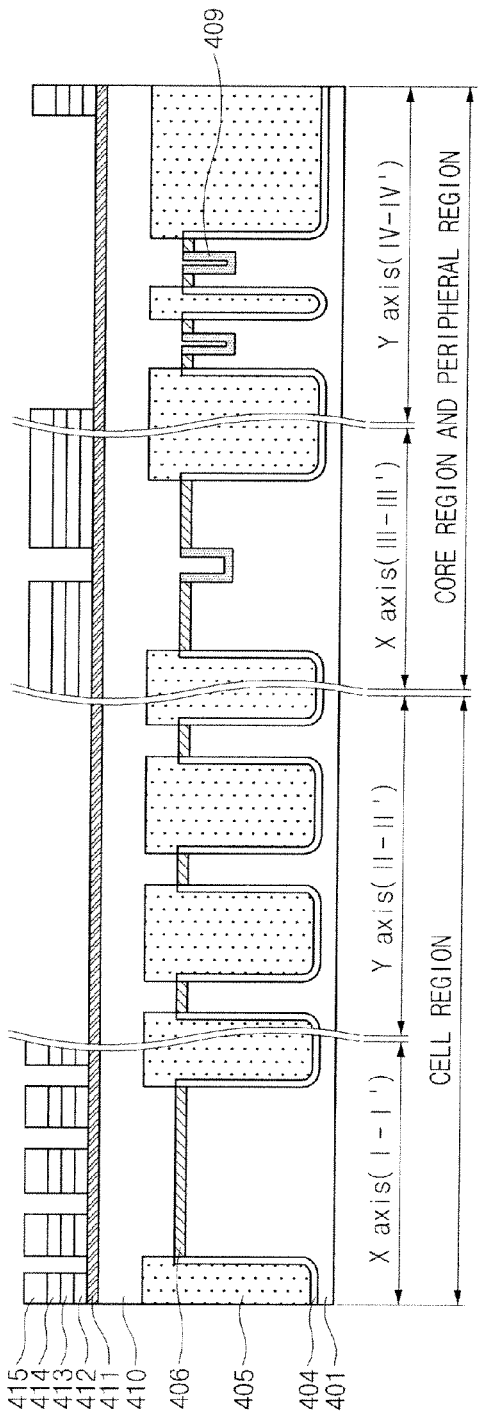

As shown in FIG. 4e, a plurality of hard mask films are formed in the cell region, the core region and the peripheral region of the semiconductor memory apparatus where the multi-channel forming film 407 is removed by the wet-etching process. A first insulating film 410, which is a hard mask having a given height, is deposited over the cell region (that is, the formation region of the cell transistor), the core region and the peripheral region. A second hard mask film 411, a third hard mask film 412, a fourth hard mask film 413, and a fifth hard mask film 414 are sequentially deposited over the first insulating film 410.

The second hard mask film 411 and the fourth hard mask film 413 may include the same material or a different material with the same etching selectivity. Also, the third hard mask film 412 and the fifth hard mask film 414 may include the same material or a different material with the same etching selectivity. For example, the second hard mask film 411 and the fourth hard mask film 413 may include a silicon film, and the third hard mask film 412 and the fifth hard mask film 414 may include an oxide film, an oxide nitride film and/or a nitride oxide film. In another embodiment, the fifth hard mask film 414 may be formed not with a single layer but with plural layers. Specifically, the fifth hard mask film 414 may include an insulating film having the same etching selectivity as that of the third hard mask film 412, and a material having the same etching selectivity as that of the second hard mask 411 and the fourth hard mask 413.

After the fifth hard mask film 414 is deposited, a second photoresist film 415 is coated with a given height. In the embodiment, one or more of an anti-reflection film and a hard mask film having a similar material to the photoresist film may be deposited over the resulting structure, and the photoresist film may be coated over the resulting structure. A photo process using the gate mask shown in FIGS. 3a and 3b is performed on the second photoresist film 415 to form a gate pattern 415. The fifth hard mask film 414 is etched with the gate pattern 415, and the fourth hard mask film 413 exposed by the etching process of the fifth hard mask film 414 is etched. The third hard mask film 412 exposed by the etching process of the fourth hard mask film 413 is etched to finish the etching process using the photoresist gate pattern. Through this etching process, a self-aligned mask including the third hard mask film 412, the fourth hard mask film 413, and the fifth hard mask film 414 is formed as shown in FIG. 4e.

Figure 4F:
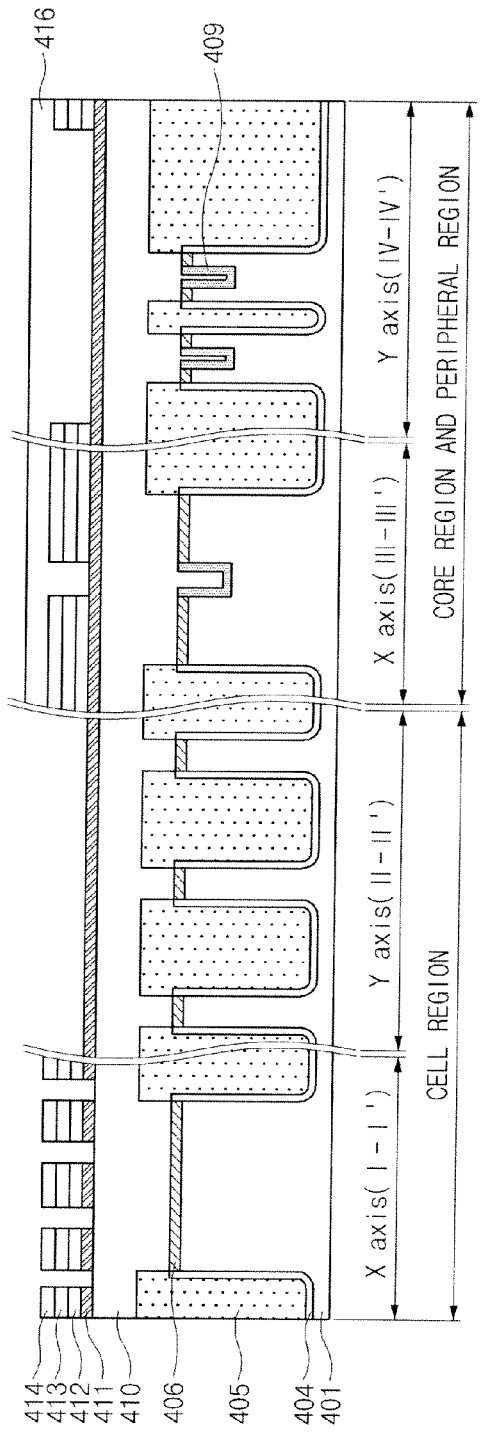

Referring to FIG. 4f, the photoresist gate pattern 415 is removed. After a third photoresist film is formed, the third photoresist film of the cell region is removed with a cell open mask, and the third photoresist film 416 is covered over the core region and the peripheral region except the cell region. By adjusting the etching selectivity, the fifth hard mask film 414, which is included in the top layer of the self-aligned hard mask in the cell region, is not removed, but only the second hard mask film 411, which is exposed, is removed. The core region and the peripheral circuit region are covered with the third photoresist film 416, so that the second hard mask film 411 remains.

Figure 4G:
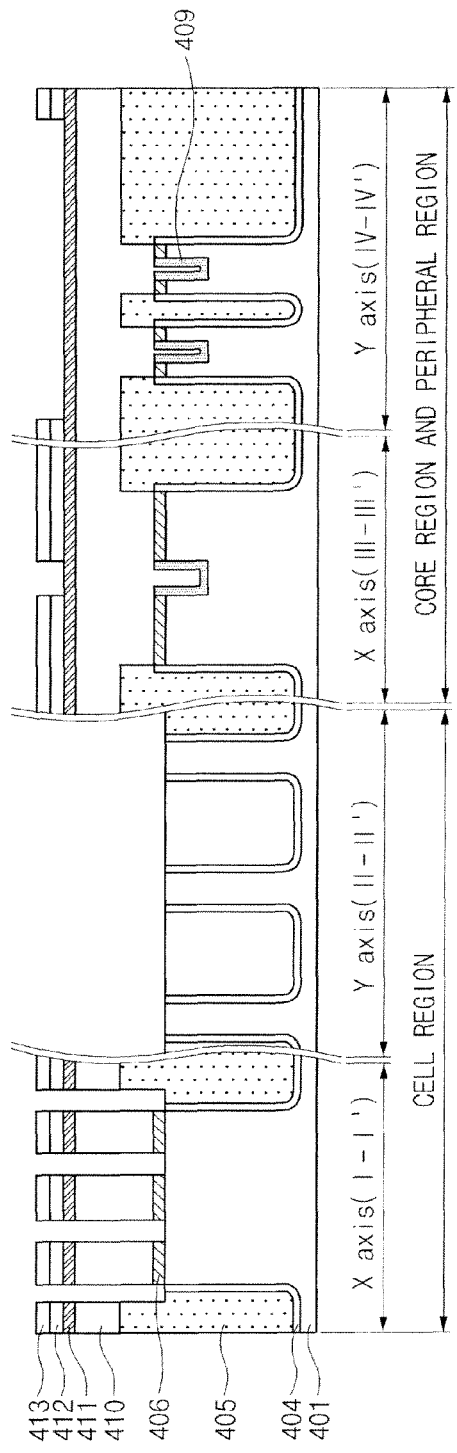

As shown in FIG. 4g, after the third photoresist film 416 that covers the core region and the peripheral region except the cell region is removed, the first insulating film 410 exposed by the self-aligned mask in the cell region is etched. Although the fifth hard mask film 414, which is included in the top layer of the self-aligned hard mask, is removed by the etching selectivity, the second hard mask film 411 exposed by the self-aligned mask in the core region and the peripheral region is not etched by the etching selectivity but remains. Then, the first buffer insulating film 406 exposed by the etching process of the first insulating film 410 is removed.

Figure 4H:
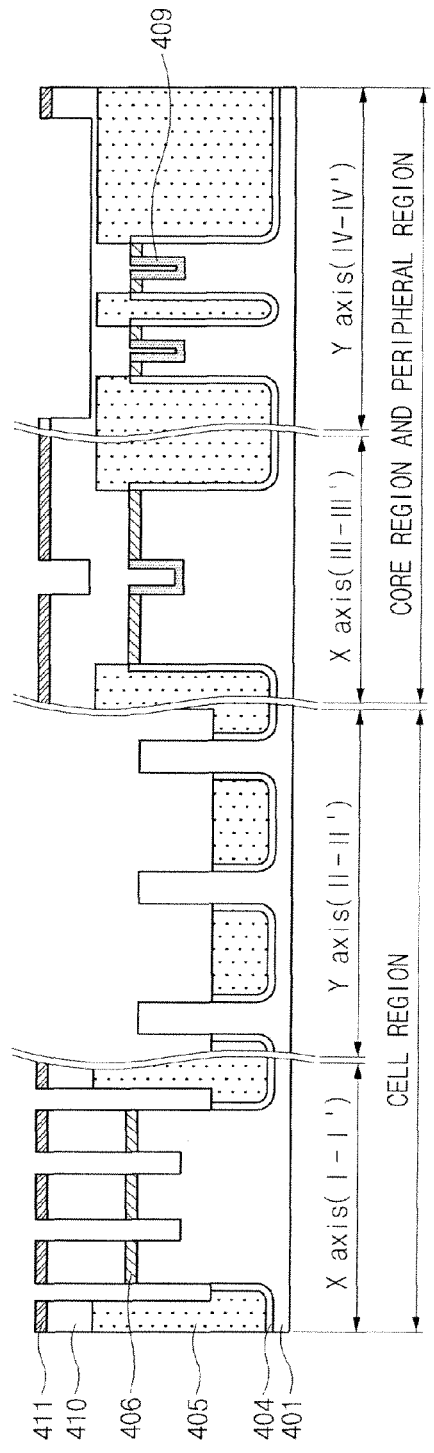

Referring to FIG. 4h, while the exposed semiconductor substrate 401 is etched in the cell region, the fourth hard mask film 413 exposed in the top layer of the self-aligned hard mask is etched, and the second hard mask film 411 exposed by the self-aligned mask is also etched. The isolation film 405 is etched to obtain a saddle-fin channel region of the transistor in the cell region. The third hard mask film 413 exposed in the top layer of the self-aligned hard mask is also etched in the cell region. The first insulating film 410 exposed by the self-aligned mask is partially etched by the etching selectivity in the core region and the peripheral region.

The second etching process illustrated in FIG. 4h not only determines the vertical length of the channel and the channel region of the saddle-fin transistor formed as a cell transistor but also determines the gate region where a gate electrode is to be formed over the channel region. As a result, the misarrangement between the gate electrode and the channel region due to usage of different mask patterns can be prevented. The depth of the semiconductor substrate and the fin height in the saddle-fin channel of the cell region determine characteristics of the fine transistor, which are determined by the etching process of the semiconductor substrate 401 and the isolation film 405 in the cell region. After this etching process, the first insulating film 410 is not completely etched but partially remains in the core region and the peripheral region. In this case, the thickness of the second hard mask film 411 and the first insulating film 410 is required to be determined corresponding to the depth of the semiconductor substrate and the fin depth. For example, the exposed semiconductor substrate 401 is etched in the cell region until the second hard mask film 411 exposed in the core region and the peripheral region is completely removed. As a result, the height of the second hard mask film 411 is preferably formed to be the same as or lower than the etched depth of the semiconductor substrate 401.

The isolation film 405, which is etched deeper than the exposed semiconductor substrate 401, is affected by the height of the first insulating film 410 exposed in the core region and the peripheral region. As shown in FIG. 4h, in the etching process of the isolation film 405 to prevent defects, the first insulating film 410 exposed in the core region and the peripheral region is not completely etched. As a result, the first insulating film 410 is formed to be higher than the depth of the isolation film 405, thereby preventing over-etching of the gate region of the transistor formed in the core region and the peripheral region, so that the gate electrode is formed not to be broader than the expected range.

Figure 4I:
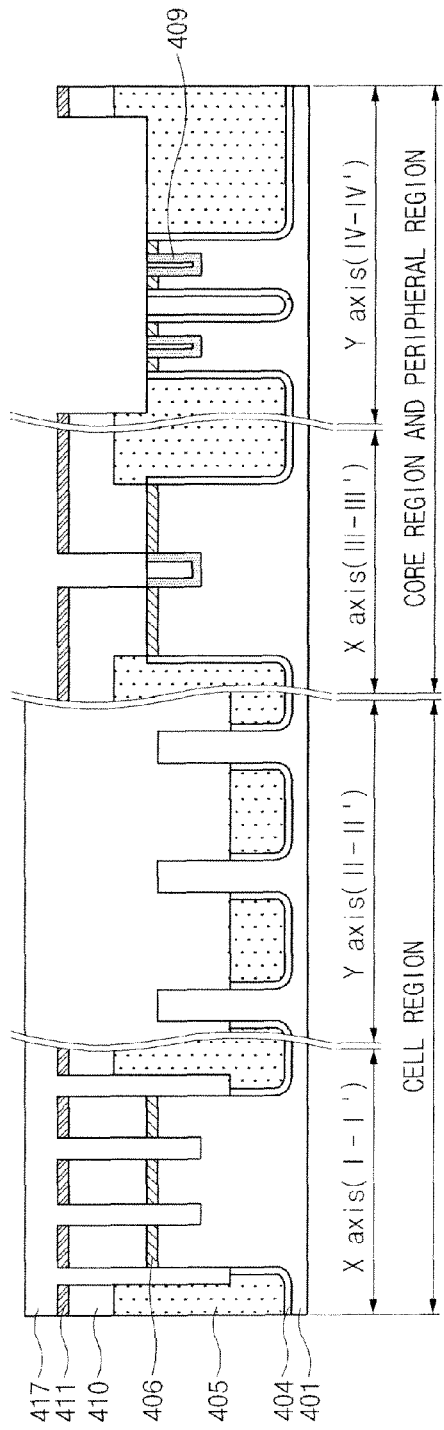

After the three-dimensional channel region of the cell region (that is, the fin region of the saddle-fin transistor), as shown in FIG. 4i, a fourth photoresist film 417 is formed, and the cell region is covered with a cell close mask. In the exposed core and peripheral regions, the first insulating film 410 is etched with the second hard mask film 411 until the first and second buffer insulating films 406 and 409 are exposed.

Figure 4J:
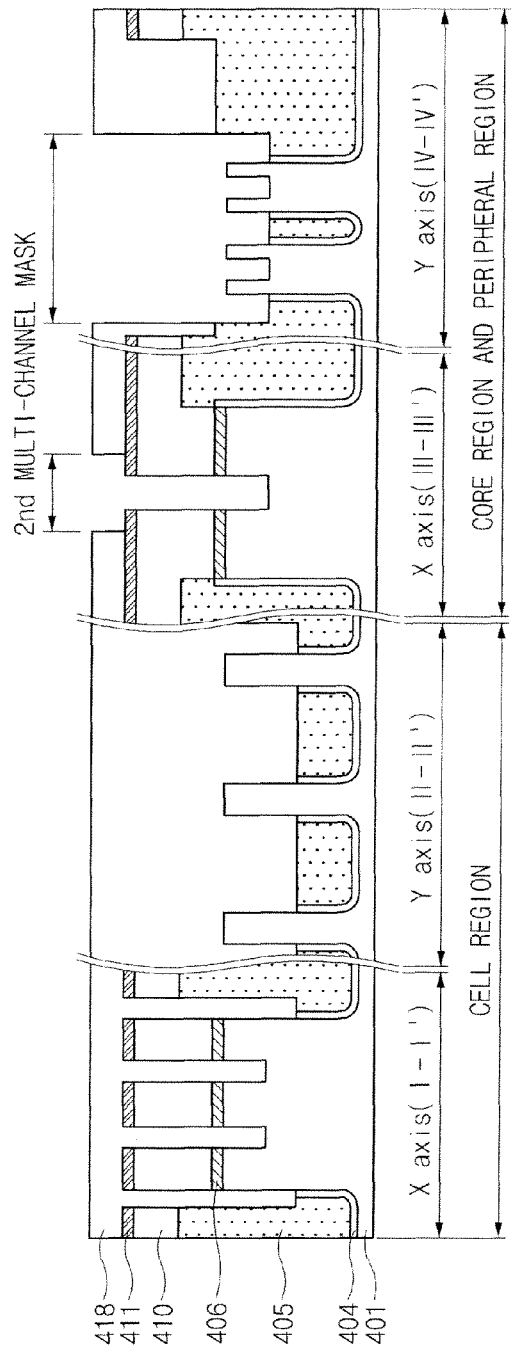

Referring to FIG. 4j, the fourth photoresist film 417 is removed, and a fifth photoresist film 418 is deposited. The region where a multi-channel of the transistor is formed in the core region and the peripheral region is exposed with the second multi-channel mask shown in FIG. 3b. The first and second buffer insulating films 406 and 409 exposed by the second multi-channel mask, the isolation film 405 and the STI insulating film 404 are etched to expose the semiconductor substrate 401 to obtain a multi-channel. The etched depth is so sufficient that the second buffer insulating film 409 may be completely removed (that is, the depth of the channel of the transistor to be formed in the core region and the peripheral region in FIG. 4c).

Figure 4K:
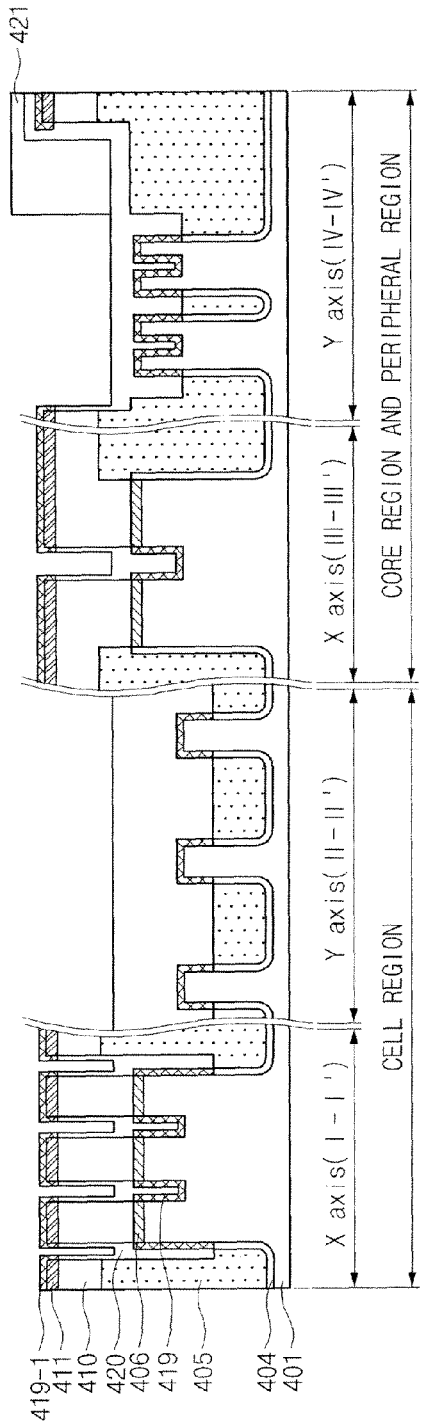

After the channel region and the gate region of the transistor to be formed in the core region and the peripheral region are formed, as shown in FIG. 4k, the fifth photoresist film 418 is removed and washed. After washing, the semiconductor substrate in the cell region and exposed in the core region and the peripheral region is oxidized to form a gate insulating film (that is, gate oxide film 419). The second hard mask film 411 that remains in the top layer of the self-aligned hard mask is also oxidized, so that a gate insulating film 419-1 is formed. After the gate insulating films 419 and 419-1 are formed, a gate lower electrode 420 is deposited. After the gate lower electrode 420 is deposited, a fifth photoresist film 421 is coated. Using the wide-range gate mask shown in FIG. 3b, only the region, which is formed with a broad range in the core region and the peripheral region not to be filled by the gate lower electrode, is covered with the fifth photoresist film 421. The etching process is performed so that the gate lower electrode 420 may remain with a given height over the semiconductor substrate 401.

A portion of the gate region having a broad area is covered with the fifth photoresist film 421 using a wide-range gate mask because the gate lower electrode 420 deposited in the gate region having a broad area can be over-etched while the gate lower electrode 420 is etched. Generally, a capacitor can be fabricated through a transistor having a gate whose width is broad in the semiconductor memory apparatus. However, when the gate lower electrode is over-etched, characteristics of the transistor and the capacitor are degraded.

Figure 4L:
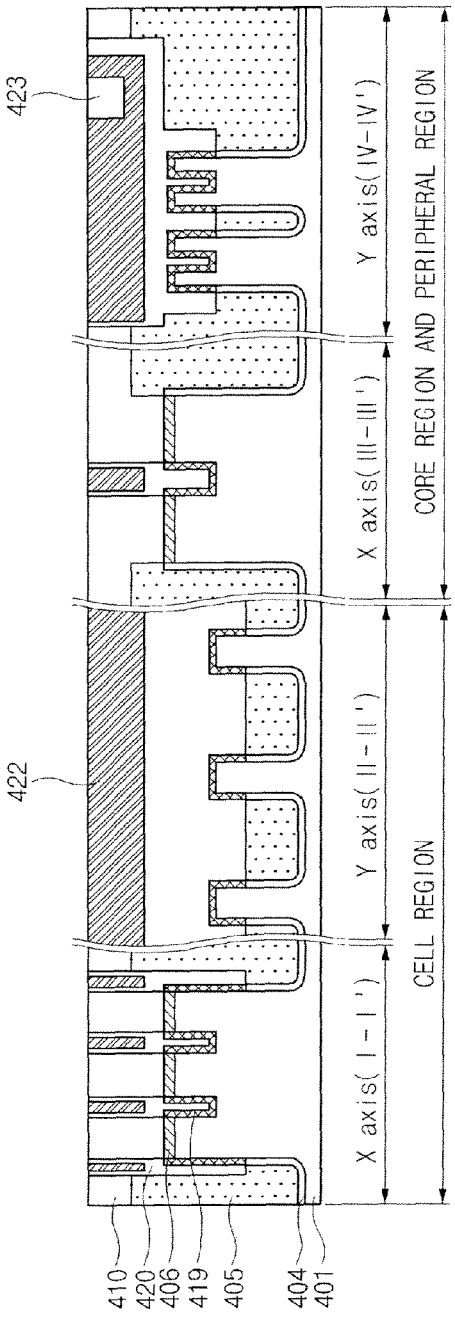

Referring to FIG. 4l, the fifth photoresist film 421 is removed and washed, a gate upper electrode is deposited over the gate lower electrode 420. Although the gate upper electrode 422 is deposited to fill the gate region in the cell region, unlike the gate region having a narrow width in the cell region, the gate region having a broad width formed by the wide-range gate mask in the core and peripheral regions cannot be filled. As a result, after the gate upper electrode 422 is deposited, a second insulating film 423 is additionally deposited over the gate upper electrode 422 so as to fill the gate region having the broad width. When an unfilled portion is generated after the gate upper electrode 422 is deposited, the second insulating film 423 prevents the over-etching of the gate upper electrode 422. After the second insulating film 423 is deposited, a CMP process is performed to expose the first insulating film 410. The gate region having the narrow width in the cell region is filled with the gate lower electrode 420 and the gate upper electrode 422. The gate region having the broad width in the core and peripheral regions is filled with the gate lower electrode 420, the gate upper electrode 422 and the second insulating film 423.

The first insulating film 410, the gate lower electrode 420, the gate upper electrode 422 and the second insulating film 423 are exposed over the planarized semiconductor structure. Referring to FIG. 4m, the exposed upper portion of the gate lower electrode 420 and the gate upper electrode 422 is etched so that the gate upper electrode 422 may remain with a given height over the gate lower electrode 420. The first insulating film 410 is wet-etched through a space generated when the upper portion of the gate lower electrode 420 and the gate upper electrode 422 is partially etched, thereby extending the space. A gate hard mask nitride film 424 is deposited over the extended space. A CMP process is performed to expose the first insulating film 410. Here, the first insulating film 410 is wet-etched to extend the space where the gate hard mask nitride film 424 is to be formed, so that the gate hard mask nitride film 424 may be formed to have a broader width than that of the gate lower electrode 420 and the gate upper electrode 422.

Referring to FIG. 4n, the first insulating film 410 is etched with the gate hard mask nitride film 424 as a mask to expose the first buffer insulating film 406 and the isolation film 405. As a result, a portion of the first insulating film 410 that surrounds the gate lower electrode 421 remains. In this way, a gate pattern is formed in the cell, core, peripheral regions by the etching process of the first insulating film 410.

Although the gate pattern includes a plurality of conductive layers that includes the lower electrode 421 and the upper electrode 422 in the above-described embodiment, a gate pattern including one conductive layer can be formed in another embodiment, or a gate pattern including a plurality of conductive layers that includes the lower electrode 421, a gate diffusion preventing metal film and the upper electrode 422 can be formed in still another embodiment.

After the gate pattern is formed, a lightly doped drain (LDD) region (not shown) and a sidewall insulating film (not shown) may be further formed in the cell region, the core region and the peripheral region. Impurities are ion-implanted into both sides of the gate pattern using the first buffer insulating film 406 to form source/drain regions.

As described above, the method of fabricating a semiconductor memory apparatus according to an embodiment of the present invention only using one gate mask may prevent generation of device defects due to mis-arrangement of a gate mask and a fin mask and of degradation of device characteristics when a gate pattern and a fin region of a saddle-fin transistor are formed. Also, a transistor formed in the core and peripheral regions except the cell region has a three-dimensional channel region, thereby preventing shortcomings due to the reduction of the design rule and the channel length, and decreasing the doping concentration to improve the operating speed of the semiconductor memory apparatus. Furthermore, transistors formed in the core and peripheral regions as well as the cell region are designed each to have a three-dimensional channel region, thereby improving uniformity of all of the transistors while the doping concentration of impurities becomes lower.

As described above, the method for manufacturing a semiconductor memory apparatus according to an embodiment of the present invention may include: forming a first channel region in a cell region by a self-alignment etching process; forming a second channel region having a three-dimensional structure in a core region and a peripheral region by an etching process using a multi-channel mask; and forming a gate pattern including a plurality of electrodes in a gate region formed over the first and second channel regions in the cell, core and peripheral regions, thereby preventing mis-arrangement. Moreover, a transistor having a three-dimensional channel region can be formed in the core and peripheral regions except the cell region, thereby solving the conventional problems due to decrease of the channel length.

The method for manufacturing a semiconductor memory apparatus may include: forming an isolation film by a STI process over a semiconductor substrate; forming a second channel region having a three-dimensional structure in a core region and a peripheral region by an etching process using a multi-channel mask; forming a self-aligned hard mask for a self-alignment etching process; forming a first channel region and a first gate region in a cell region by a self-alignment etching process; forming a second gate region over the second channel region in the core and peripheral regions by an self-alignment etching process; and forming a gate pattern including a plurality of electrodes in the cell, core and peripheral regions including the first and second gate regions.

The semiconductor memory apparatus including a saddle-fin transistor according to an embodiment of the present invention may include a plurality of saddle-fin transistors each including a three-dimensional single channel region, and a plurality of multi-channel transistors each including a three-dimensional multi-channel region. Particularly, each gate pattern of the sale-fin transistors and the multi channel transistors may include plural electrodes. The upper portion of the gate pattern may be surrounded with a gate hard mask nitride film, and the lower portion of the gate lower electrode may be surrounded with an oxide film which is the first insulating film 410, thereby reducing parasite capacitance generated between an active region and the gate pattern.

The above embodiments of the present invention are illustrative and not limitative. Various alternatives and equivalents are possible. The invention is not limited by the type of deposition, etching polishing, and patterning steps describe herein. Nor is the invention limited to any specific type of semiconductor device. For example, the present invention may be implemented in a dynamic random access memory (DRAM) device or non volatile memory device. Other additions, subtractions, or modifications are obvious in view of the present disclosure and are intended to fall within the scope of the appended claims.

What is claimed is:

1. A method for manufacturing a semiconductor memory apparatus, the method comprising:
   forming a channel region and a gate region through a self-alignment etching process on a cell region; and
   forming a three-dimensional multi-channel region through an etching process using a first multi-channel mask on a core region and a peripheral region and forming a gate region through an etching process using a second multi-channel mask.

2. The method according to claim 1, further comprising forming a device isolation film over a semiconductor substrate.

3. The method according to claim 1, wherein the forming a channel region and a gate region includes:
   forming a self-aligned hard mask over the semiconductor substrate; and
   etching using the self-aligned hard mask.

4. The method according to claim 3, wherein the forming a self-aligned hard mask includes:
   forming a plurality of hard mask films over the semiconductor substrate;
   depositing a photoresist film over the hard mask films to pattern the photoresist film using a gate mask; and
   etching the hard mask films with the patterned photoresist film.

5. The method according to claim 4, wherein the hard mask films include first to fifth hard mask films, the second hard mask film has the same etching selectivity as that of the fourth hard mask film, and the third hard mask film has the same etching selectivity as that of the fifth hard mask film.

6. The method according to claim 5, wherein the second and fourth hard mask films are formed with the same material, and the third and fifth hard mask films are formed with the same material.

7. The method according to claim 5, wherein the second hard mask film includes a silicon film, and the third hard mask film includes an oxide film, an oxide nitride film or a nitride oxide film.

8. The method according to claim 3, wherein the performing-an-etching-process-using-the-self-aligned-hard-mask includes:
   exposing the cell region using a cell open mask after forming a photoresist film over the resulting structure; and
   etching the semiconductor substrate and the device isolation film in the cell region using the self-aligned hard mask.

9. The method according to claim 1, wherein the forming a three dimensional multi-channel region and a gate region includes:
   forming the multi-channel region through an etching process performed on the semiconductor substrate using the first multi-channel mask;
   forming a self-aligned hard mask to be broader than the multi-channel region; and
   etching the insulating film and the device isolation film exposed of the multi-channel region using the second multi-channel mask to form the gate region.

10. The method according to claim 9, wherein the forming the multi-channel region includes:
    depositing a multi-channel forming film over the semiconductor substrate and the device isolation film;
    coating a photoresist film and etching the photoresist film with the first multi-channel mask to expose the multi-channel forming film;
    dry-etching the exposed multi-channel forming film so that the multi-channel forming film remains on the side surface of the device isolation film;
    etching the semiconductor substrate exposed between the residual multi-channel forming films; and
    removing the residual photoresist film; and
    forming an insulating film over the semiconductor substrate exposed by the etching process.

11. The method according to claim 9, wherein the forming the gate region includes:
    coating a photoresist film;
    etching the photoresist film using the second multi-channel mask whose width is broader than that of the first multi-channel mask so as to expose only the multi-channel region;
    etching a portion of the device isolation film and the insulating film in the exposed multi-channel region; and
    removing the residual photoresist film.

12. The method according to claim 1, further comprising forming a gate pattern in the gate region formed in the cell region, the core region and the peripheral region.

13. The method according to claim 12, wherein the gate pattern includes a conductive layer.

14. The method according to claim 12, wherein the gate pattern includes a gate lower electrode and a gate upper electrode disposed over the gate lower electrode.

15. The method according to claim 14, wherein the gate lower electrode of the gate pattern surrounds the side surface of the gate upper electrode, the upper portion of the gate lower electrode and the gate upper electrode are surrounded with the gate hard mask nitride film, and the lower portion of the gate lower electrode is surrounded with an oxide film.

16. The method according to claim 12, wherein the forming a gate pattern includes:
    depositing a gate lower electrode over the gate region;
    depositing a gate upper electrode and a nitride film over the gate lower electrode to planarize the gate upper electrode and the nitride film;
    etching the gate lower electrode and the upper portion of the gate upper electrode;
    wet-etching a portion where the gate electrode is etched to broaden the width; and
    forming a gate hard mask nitride film in a space where the gate electrode is etched.

17. The method according to claim 16, wherein the forming a gate pattern further includes: forming a gate diffusion preventing metal film between the gate lower electrode and the gate upper electrode.

18. The method according to claim 16, wherein the forming a gate pattern includes:
   coating a photoresist film after forming the gate lower electrode;
   etching the photoresist film to expose the multi-channel region in the cell region, the core region and the peripheral region;
   etching the exposed gate lower electrode so that the gate lower electrode remains uniformly; and
   removing the residual photoresist film.

19. A semiconductor memory apparatus comprising:
   a unit cell including a saddle-fin transistor having a three-dimensional signal channel region as a cell transistor; and
   core and peripheral regions that include a multi-channel transistor having a three-dimensional multi-channel region,
   wherein a gate pattern included in each of the saddle-fin transistor and the multi-channel transistor includes a gate lower electrode that surrounds a side surface of a gate upper electrode, the upper portion of the gate lower electrode and the gate upper electrode are surrounded with a gate hard mask nitride film, and the lower portion of the gate lower electrode is surrounded with an oxide film.

20. A method for manufacturing a semiconductor memory apparatus, the method comprising:
   forming a device isolation film over a semiconductor substrate;
   forming a multi-channel region in core and peripheral regions through an etching process using a first multi-channel mask;
   forming a self-aligned hard mask in a cell region, the core and peripheral regions;
   simultaneously forming a channel region and a gate region in the cell region through a self-alignment etching process using the self-aligned hard mask;
   forming a gate region over the channel region in the core and peripheral regions through the self-alignment etching process and an etching process using a second multi-channel mask; and
   forming a gate pattern in the gate region of the cell, core and peripheral regions.

21. The method according to claim 20, wherein the forming a multi-channel region includes:
   depositing a multi-channel forming film over the semiconductor substrate and the device isolating film;
   coating a photoresist film and etching the photoresist film using the first multi-channel mask to expose the multi-channel forming film;
   dry-etching the exposed multi-channel forming film so that the multi-channel forming film remains on the side surface of the device isolation film;
   etching the semiconductor substrate exposed between the residual multi-channel forming film;
   removing the residual photoresist film; and
   forming an insulating film over the semiconductor substrate exposed by the etching process.

22. The method according to claim 20, wherein the forming a self aligned hard mask includes:
   forming a plurality of insulating films over the semiconductor substrate and the device isolation film;
   depositing a photoresist film over the insulating films to pattern the photoresist film using a gate mask; and
   etching the insulating films with the patterned photoresist film.

23. The method according to claim 20, wherein the forming a channel region and a gate region includes:
   exposing the cell region; and
   etching the semiconductor substrate with the self-aligned hard mask.

24. The method according to claim 20, wherein forming a gate region over the channel region in the core and peripheral regions includes:
   coating a photoresist film;
   etching the photoresist film using the second multi-channel mask whose width is broader than that of the first multi-channel mask so as to expose only the multi-channel region;
   etching a portion of the device isolation film and the insulating film in the exposed multi-channel region; and
   removing the residual photoresist film.

* * * * *